United States Patent
Garlapati et al.

(10) Patent No.: US 10,700,829 B2
(45) Date of Patent: Jun. 30, 2020

(54) COMBINING DECISION METRICS OF A SCRAMBLED PAYLOAD

(71) Applicant: QUALCOMM Incorporated, San Diego, CA (US)

(72) Inventors: Shravan Kumar Reddy Garlapati, San Diego, CA (US); Afshin Haftbaradaran, San Diego, CA (US); Alessandro Risso, San Diego, CA (US); Alexandre Pierrot, San Diego, CA (US); Chinmay Vaze, San Diego, CA (US); Hari Sankar, San Diego, CA (US); Li Zhang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/268,186

(22) Filed: Feb. 5, 2019

(65) Prior Publication Data
US 2019/0253213 A1    Aug. 15, 2019

Related U.S. Application Data

(60) Provisional application No. 62/630,679, filed on Feb. 14, 2018.

(51) Int. Cl.
*H04L 5/00*    (2006.01)
*H04L 1/00*    (2006.01)
(Continued)

(52) U.S. Cl.
CPC .......... *H04L 5/0046* (2013.01); *H03M 13/13* (2013.01); *H03M 13/2906* (2013.01);
(Continued)

(58) Field of Classification Search
None
See application file for complete search history.

(56) References Cited

U.S. PATENT DOCUMENTS

| | | | |
|---|---|---|---|
| 8,588,347 B1 * | 11/2013 | Petrovic | H04L 1/08 375/340 |
| 10,568,102 B2 * | 2/2020 | Luo | H04L 5/0053 |

(Continued)

OTHER PUBLICATIONS

Ericsson: "Arrangement of PBCH Fields for Polar Codes", 3GPP Draft, R1-1721461 Arrangement of PBCH Fields for Polar Codes, 3rd Generation Partnership Project (3GPP), Mobile Competence Centre, 650, Route Des Lucioles, F-06921 Sophia-Antipolis Cedex, Fran, vol. RAN WG1, No. Reno, USA, Nov. 27, 2017-Dec. 1, 2017, Dec. 1, 2017 (Dec. 1, 2017), XP051370564, 21 Pages, Retrieved from the Internet: URL:http://www.3gpp.org/ftp/tsg%5Fran/WG1%5FRL1/TSGR1%5F91/Docs/ [retrieved on Dec. 1, 2017].
(Continued)

*Primary Examiner* — Otis L Thompson, Jr.
(74) *Attorney, Agent, or Firm* — Patterson & Sheridan, L.L.P.

(57) ABSTRACT

Certain aspects of the present disclosure generally relate to techniques for combining a plurality of decision metrics of a scrambled payload in a 5G wireless communications system. For example, in some cases, combining decision metrics of a scrambled payload may generally involve receiving a first payload at a receiver that was scrambled both before and after encoding, generating a second payload at the receiver with selectively set payload mask bits, and using the selectively-set payload mask bits in the second payload to descramble the first payload.

44 Claims, 10 Drawing Sheets

(51) Int. Cl.
H04L 27/26 (2006.01)
H03M 13/13 (2006.01)
H03M 13/29 (2006.01)
H04L 1/18 (2006.01)
H03M 13/09 (2006.01)
H04J 11/00 (2006.01)
H04L 25/03 (2006.01)

(52) U.S. Cl.
CPC .......... *H04L 1/0045* (2013.01); *H04L 1/0057* (2013.01); *H04L 1/0061* (2013.01); *H04L 1/1845* (2013.01); *H04L 27/2649* (2013.01); *H03M 13/09* (2013.01); *H04J 11/0079* (2013.01); *H04L 25/03318* (2013.01)

(56) References Cited

U.S. PATENT DOCUMENTS

| | | | | |
|---|---|---|---|---|
| 2010/0180173 | A1* | 7/2010 | Batra | H04L 1/1812 714/751 |
| 2011/0228883 | A1* | 9/2011 | Liu | H04L 1/08 375/341 |
| 2011/0289367 | A1* | 11/2011 | Carlach | H03M 13/136 714/701 |
| 2012/0014478 | A1* | 1/2012 | Gotman | H04L 1/0052 375/316 |
| 2012/0307691 | A1* | 12/2012 | Wang | H04L 25/03171 370/280 |
| 2017/0126456 | A1* | 5/2017 | Lee | H04W 84/12 |
| 2017/0170930 | A1* | 6/2017 | Guzelgoz | H04L 5/0055 |
| 2017/0338907 | A1* | 11/2017 | Atungsiri | H03M 13/2707 |
| 2018/0220426 | A1* | 8/2018 | Rico Alvarino | H04W 72/042 |
| 2018/0242324 | A1* | 8/2018 | Luo | H04W 72/0466 |
| 2018/0375616 | A1* | 12/2018 | Beale | H04L 1/1816 |
| 2019/0068270 | A1* | 2/2019 | Schenk | H04B 7/0408 |
| 2019/0372711 | A1* | 12/2019 | Luo | H04W 72/005 |

OTHER PUBLICATIONS

Ericsson: "Simulation Results for PBCH-DRMS Sequence Acquisition and PBCH", 3GPP Draft, R4-1712785 NR PBCH Simulation Results, 3rd Generation Partnership Project (3GPP), Mobile Competence Centre, 650, Route Des Lucioles, F-06921 Sophia-Antipolis Cedex, France, vol. RAN WG4, No. Reno, NV, USA, Nov. 27, 2017-Dec. 1, 2017, Nov. 17, 2017 (Nov. 17, 2017), XP051374347, 8 Pages, Retrieved from the Internet: URL:http://www.3gpp.org/ftp/tsg%3Fran/WG4%5FRadio/TSGR4%5F85/Docs/ [retrieved on Nov. 17, 2017].

International Search Report and Written Opinion—PCT/US2019/016897—ISA/EPO—dated Apr. 26, 2019.

Qualcomm Incorporated: "PBCH Design Using Polar Codes", 3GPP Draft, R1-1718590 PBCH Design Using Polar Codes, 3rd Generation Partnership Project (3GPP), Mobile Competence Centre, 650, Route Des Lucioles, F-06921 Sophia-Antipolis Cedex, France, vol. RAN WG1, No. Prague, Czech, Oct. 9, 2017-Oct. 13, 2017, Oct. 8, 2017 (Oct. 8, 2017), XP051341767, 9 Pages, Retrieved from the Internet: URL:http://www.3gpp.org/ftp/meetings_3gpp_sync/RAN1/DOCS/ [retrieved on Oct. 8, 2017].

* cited by examiner

COMBINING DECISION METRICS OF A SCRAMBLED PAYLOAD

CLAIM OF PRIORITY UNDER 35 U.S.C. § 119

This application claims benefit of U.S. Provisional Patent Application Ser. No. 62/630,679, filed Feb. 14, 2018, which is herein incorporated by reference in its entirety.

TECHNICAL FIELD

Certain aspects of the present disclosure generally relate to wireless communications and, more particularly, to methods and apparatus for combining decision metrics of a scrambled payload.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an e NodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, gNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. 5G NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

Additionally, 5G NR is expected to introduce new encoding and decoding schemes that improve transmission and reception of data. For example, Polar codes are currently being considered as a candidate for error-correction in next-generation wireless systems such as NR. Polar codes are a relatively recent breakthrough in coding theory, which have been proven to asymptotically (for code size N approaching infinity) achieve the Shannon capacity. However, while Polar codes perform well at large values of N, for lower values of N, polar codes suffer from poor minimum distance, leading to the development of techniques such as successive cancellation list (SCL) decoding, which leverage a simple outer code having excellent minimum distance, such as a CRC or parity-check, on top of a polar inner code, such that the combined code has excellent minimum distance.

However, as the demand for mobile broadband access continues to increase, there exists a need for further improvements in 5G NR technology, such as improvements in decoding performance of Polar code for NR. Preferably, these improvements should be applicable to other multi-access technologies and the telecommunication standards that employ these technologies.

BRIEF SUMMARY OF SOME EMBODIMENTS

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Certain aspects of the present disclosure provide a method for wireless communications in a network. The method generally includes receiving, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword; generating, in response to receiving the current transmission, a second payload, wherein generating the second payload comprises selectively setting a plurality of payload mask bits in the second payload; encoding the second payload to form a second codeword; generating a first scrambling sequence; removing, based on the first scrambling sequence, a first impact in the received LLRs associated with the scrambling of the second time; removing, based on the second codeword, a second impact in the received LLRs associated with the scrambling of the first time; combining, after the first impact and the second impact in the received LLRs is removed, the received LLRs of the current transmission with LLRs of a previous transmission; and decoding the first codeword based, at least in part, on the combined LLRs of the current transmission and the LLRs of the previous transmission.

Certain aspects of the present disclosure provide an apparatus for wireless communications in a network. The apparatus generally includes at least one processor configured to receive, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword; generate, in response to receiving the current transmission, a second payload, wherein generating the second payload comprises selectively setting a plurality of payload mask bits in the second payload; encoding the second payload to form a second codeword; generate a first scrambling sequence; remove, based on the first scrambling sequence, a first impact in the received LLRs associated with the scrambling of the second time; remove, based on the second codeword, a second impact in the received LLRs associated with the scrambling of the first time; combine, after the first impact and the second impact in the received LLRs is removed, the received LLRs of the current transmission with LLRs of a previous transmission; and decode the first codeword based, at least in part, on the combined LLRs of the current transmission and the LLRs of the previous transmission. The apparatus also generally includes a memory coupled with the at least one processor.

Certain aspects of the present disclosure provide an apparatus for wireless communications in a network. The method generally includes means for receiving, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword; means for generating, in response to receiving the current transmission, a second payload, wherein generating the second payload comprises selectively setting a plurality of payload mask bits in the second payload; means for encoding the second payload to form a second codeword; means for generating a first scrambling sequence; means for removing, based on the first scrambling sequence, a first impact in the received LLRs associated with the scrambling of the second time; means for removing, based on the second codeword, a second impact in the received LLRs associated with the scrambling of the first time; means for combining, after the first impact and the second impact in the received LLRs is removed, the received LLRs of the current transmission with LLRs of a previous transmission; and means for decoding the first codeword based, at least in part, on the combined LLRs of the current transmission and the LLRs of the previous transmission.

Certain aspects of the present disclosure provide a non-transitory computer-readable medium for wireless communications in a network. The non-transitory computer-readable medium generally includes instructions that, when executed by at least one processor, cause the at least one processor to receive, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword; generate, in response to receiving the current transmission, a second payload, wherein generating the second payload comprises selectively setting a plurality of payload mask bits in the second payload; encoding the second payload to form a second codeword; generate a first scrambling sequence; remove, based on the first scrambling sequence, a first impact in the received LLRs associated with the scrambling of the second time; remove, based on the second codeword, a second impact in the received LLRs associated with the scrambling of the first time; combine, after the first impact and the second impact in the received LLRs is removed, the received LLRs of the current transmission with LLRs of a previous transmission; and decode the first codeword based, at least in part, on the combined LLRs of the current transmission and the LLRs of the previous transmission.

The techniques may be embodied in methods, apparatuses, and computer program products. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
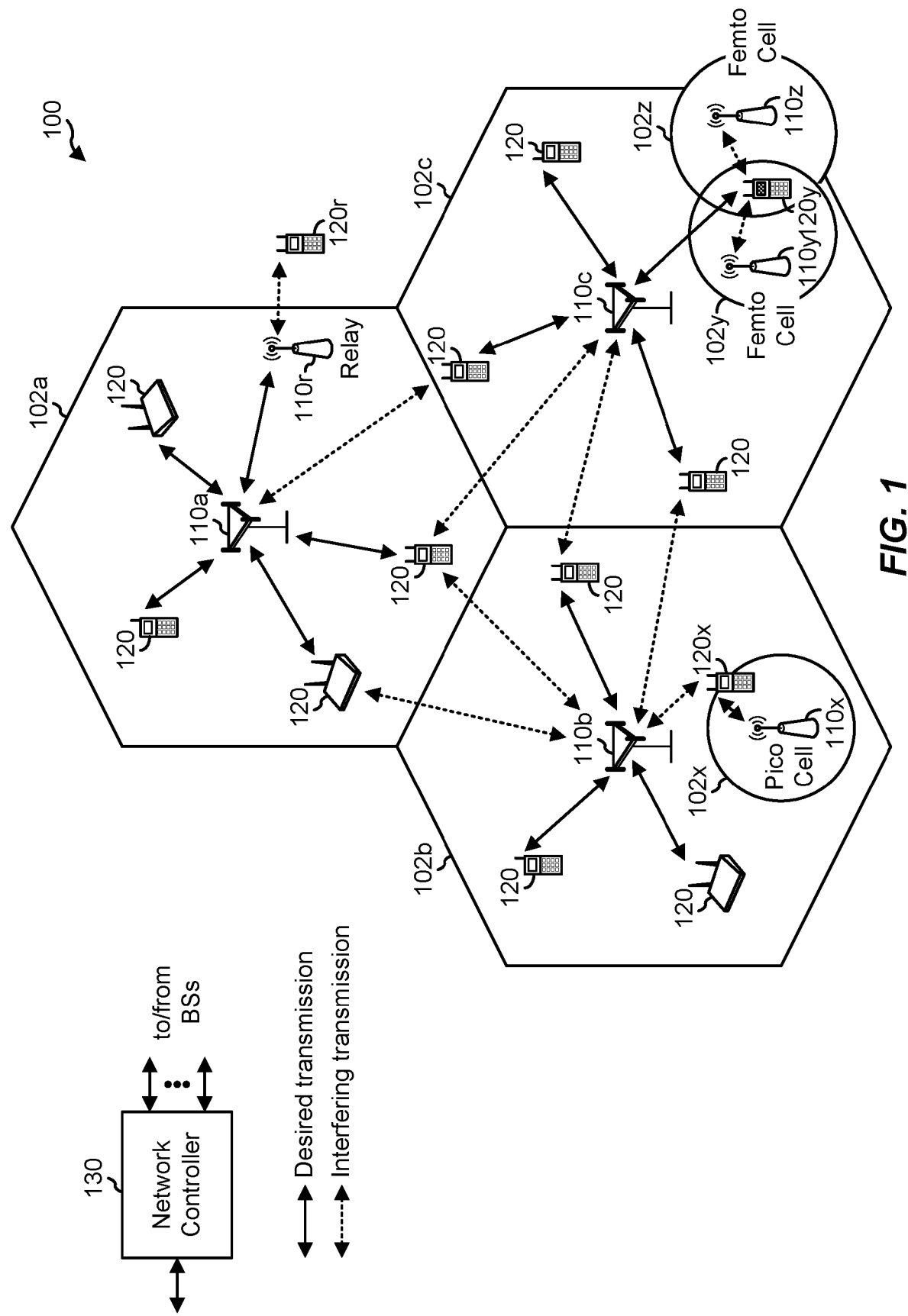
FIG. 1 is a block diagram conceptually illustrating an example telecommunications system, in accordance with certain aspects of the present disclosure.

Certain aspects of the present disclosure generally relate to techniques for combining a plurality of decision metrics of a scrambled payload in a 5G wireless communications system. For example, in some cases, combining decision metrics of a scrambled payload may generally involve receiving a first payload at a receiver that was scrambled both before and after encoding, generating a second payload at the receiver with selectively set payload mask bits, and using the selectively-set payload mask bits in the second payload to descramble the first payload.

NR may support various wireless communication services, such as Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra reliable low latency communications (URLLC). These services may include latency and reliability requirements. These services may also have different transmission time intervals (TTI) to meet respective quality of service (QoS) requirements. In addition, these services may co-exist in the same subframe.

Aspects of the present disclosure generally relate to wireless communications and, more particularly, to methods and apparatus for combining decision metrics of a scrambled payload. For example, in 5G, a payload may be scrambled both before and after polar encoding, and thus, combining scrambled payloads over multiple transmissions before decoding requires a different approach than used in 4G LTE. Accordingly, aspects of the present disclosure propose techniques whereby when a receiving device receives a current transmission of LLRs corresponding to a first payload, the receiving device generates a second payload by selectively setting a plurality of payload mask bits. According to aspects, these plurality of selectively set payload mask bits may be used to remove the impact (e.g., descramble) of the scrambling occurring before the first payload is encoded.

Example Wireless Communications System

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA), time division synchronous CDMA (TD-SCDMA), and other variants of CDMA. cdma2000 covers IS-2000, IS-95 and IS-856 standards. A TDMA network may implement a radio technology such as global system for mobile communications (GSM). An OFDMA network may implement a radio technology such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LTE) and LTE-Advanced (LTE-A), in both frequency division duplex (FDD) and time division duplex (TDD), are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies Additionally, the techniques presented herein may be used in various other non-wireless communication networks, such as fiber network, hard-wire "copper" networks, and the like, or in digital storage or compression. In other words, the techniques presented herein may be used in any system which includes an encoder.

FIG. 1 illustrates an example wireless network 100, such as a new radio (NR) or 5G network, in which aspects of the present disclosure may be performed, for example, for combining decision metrics of a scrambled payload. In some cases, the network 100 may be a fiber network, a hard-wire "copper" network, or the like.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed, employing a multi-slice network architecture.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.).

A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communications device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR/5G.

5G NR may utilize OFDM with a CP on the uplink and downlink and include support for half-duplex operation using TDD. A single component carrier bandwidth of 100 MHz may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., gNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
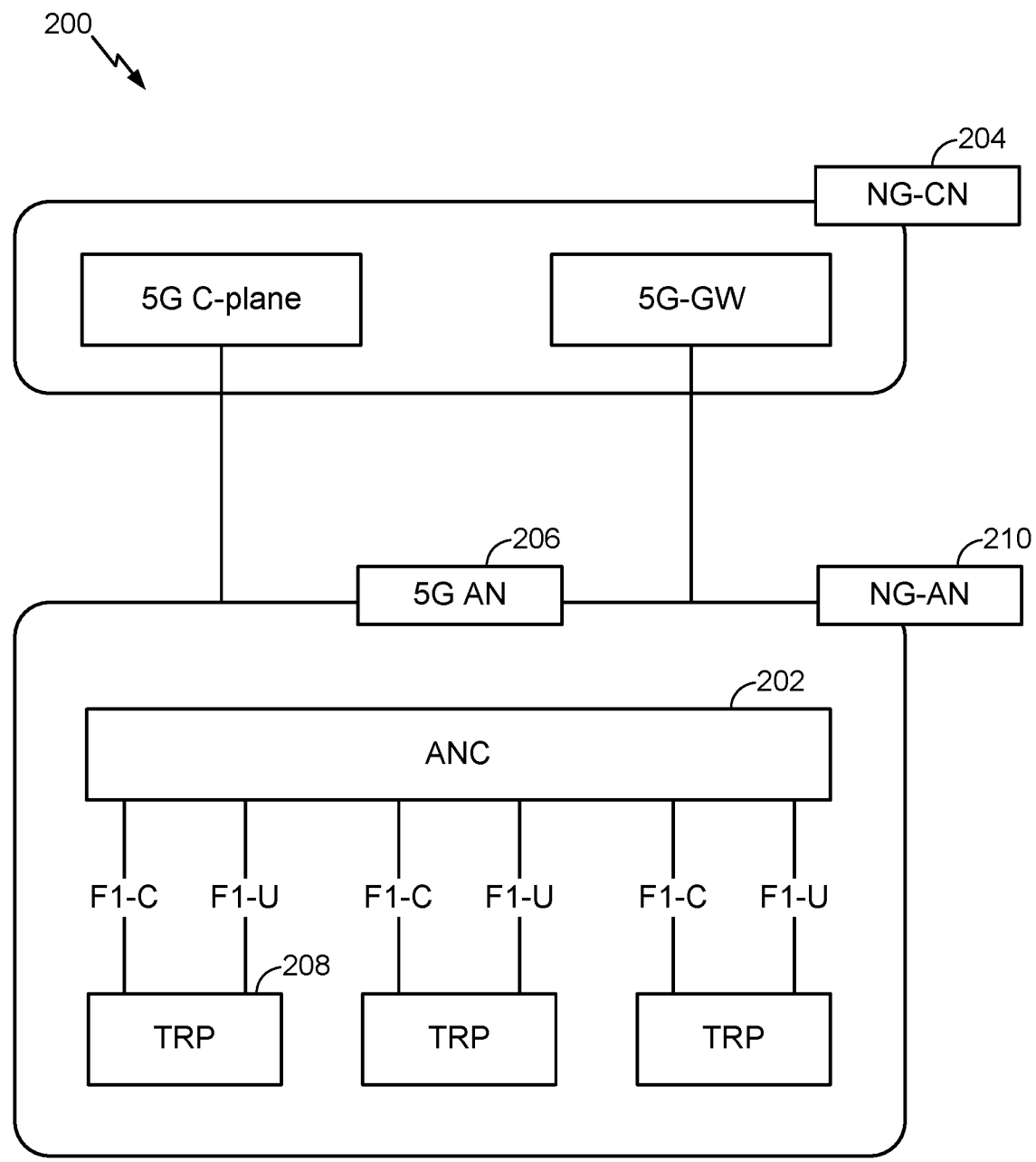
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture of the distributed RAN 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
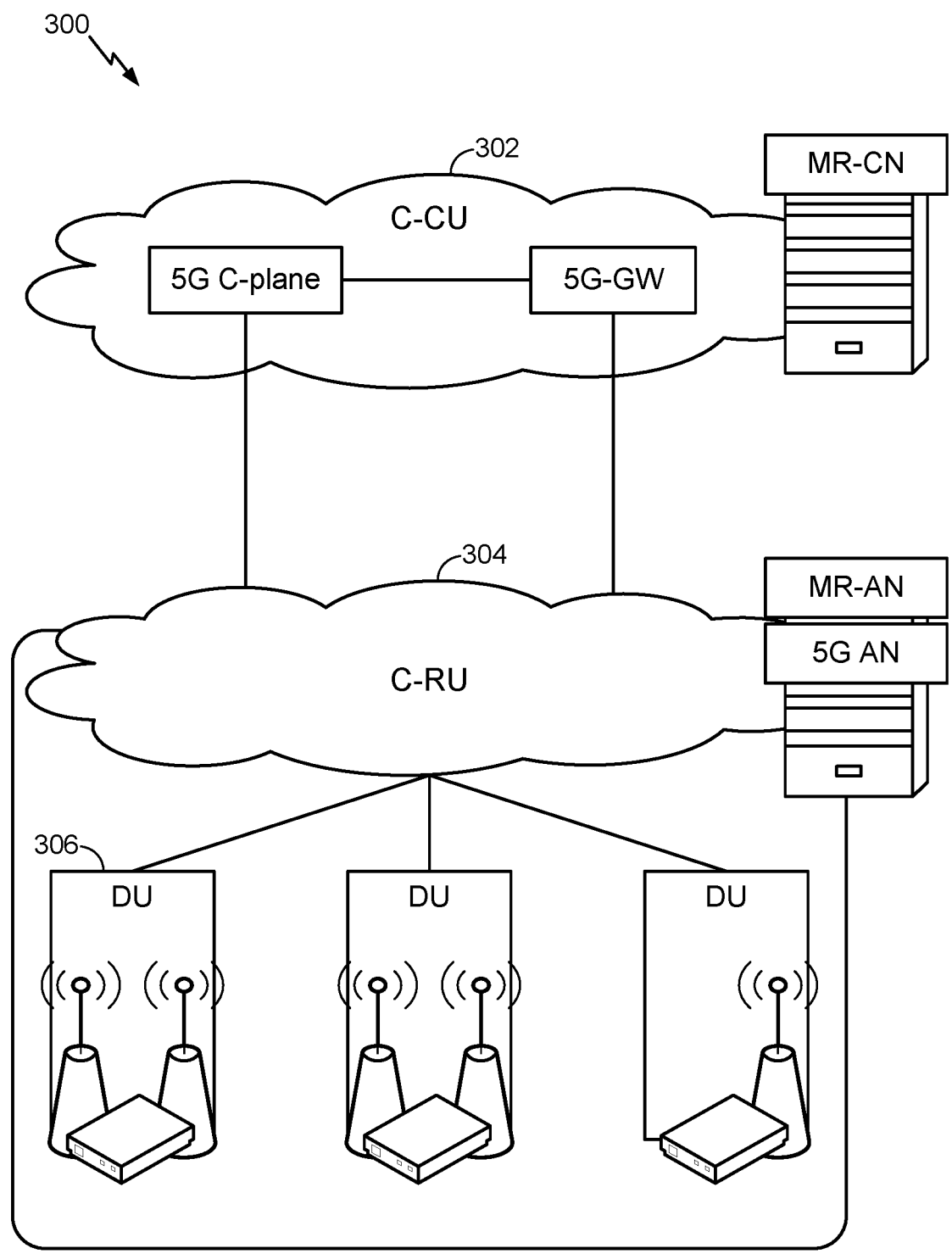
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
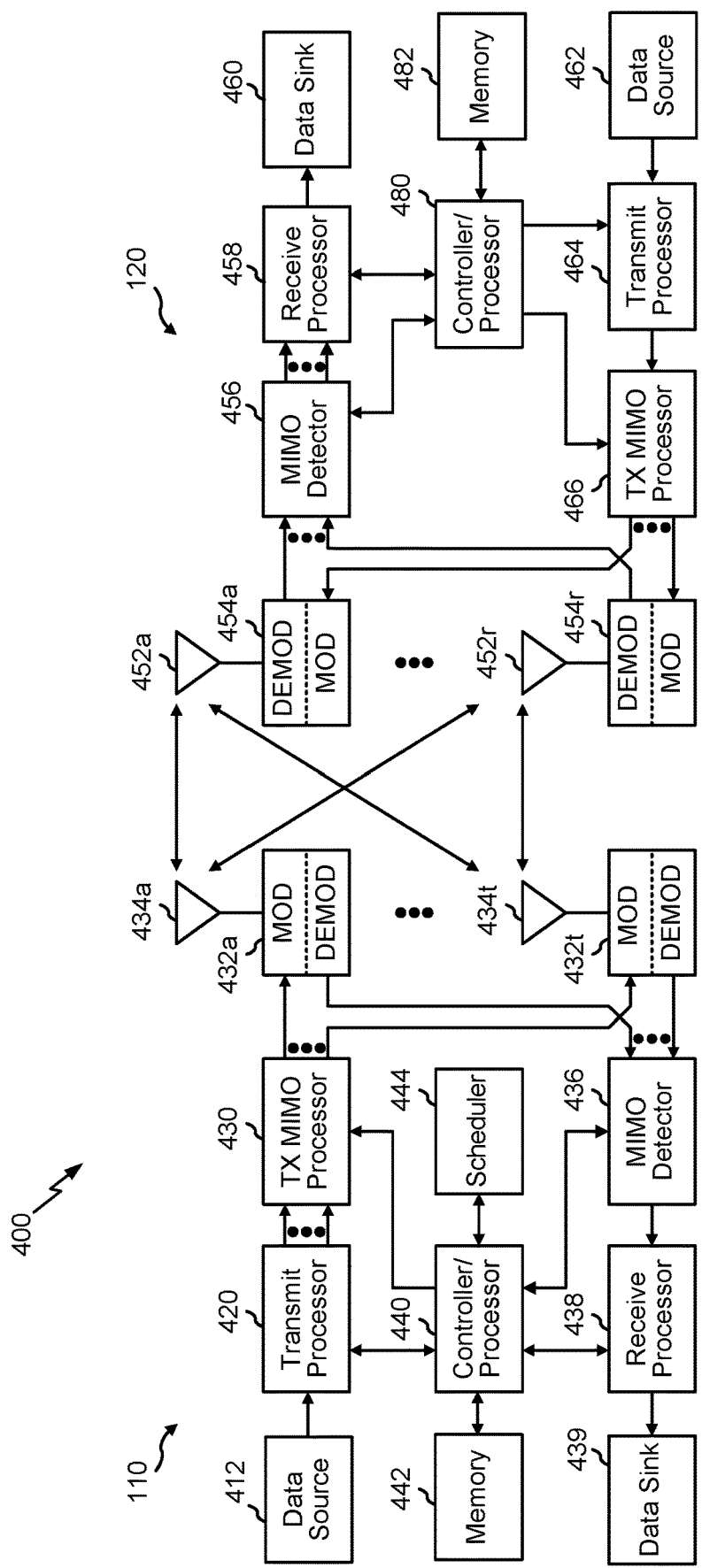
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein and illustrated with reference to FIG. 11.

According to aspects, for a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 6, and/or other processes for the techniques described herein. The processor 480 and/or other processors and modules at the UE 120 may also perform or direct, e.g., the execution of the functional blocks illustrated in FIG. 7, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
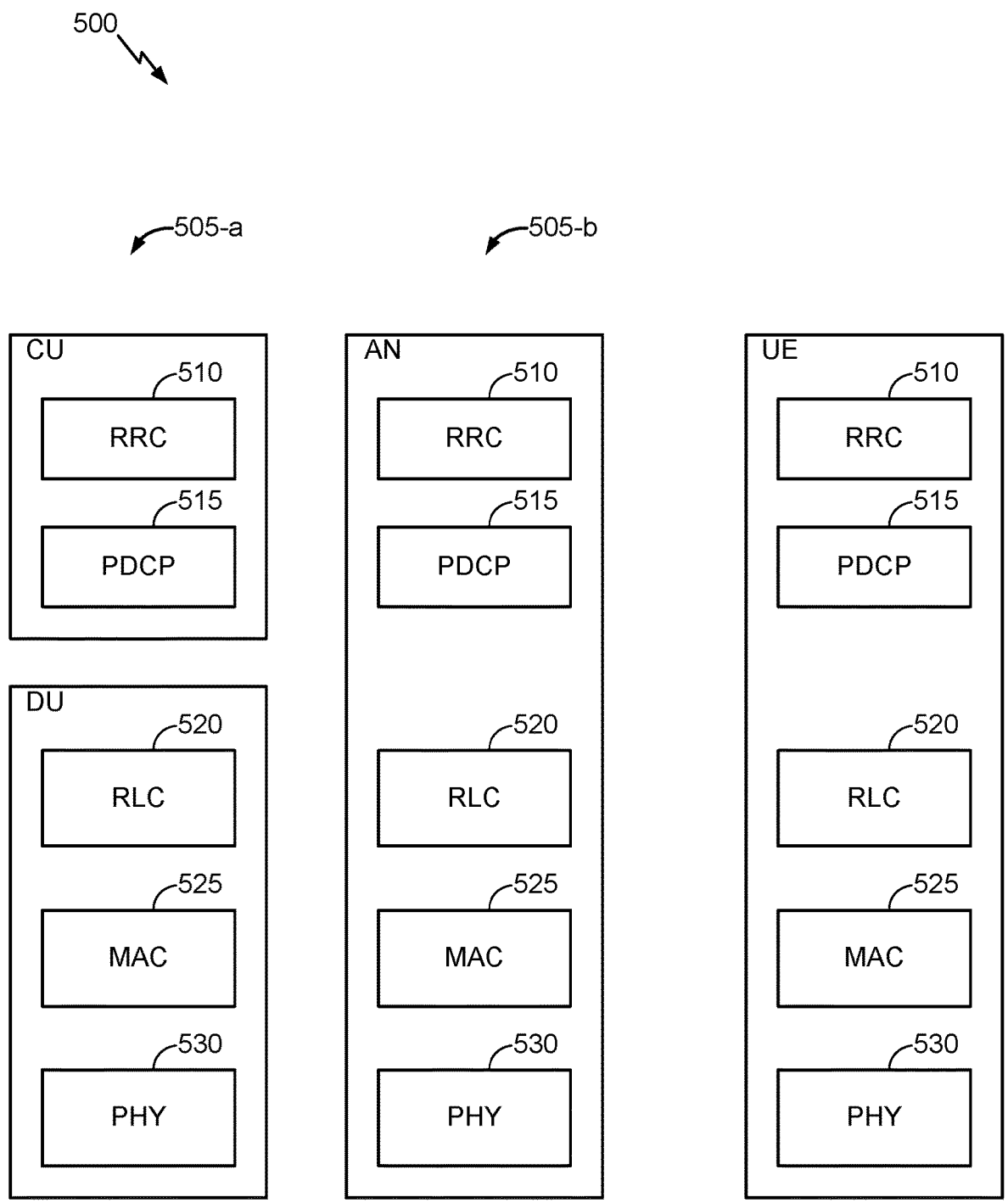
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack (e.g., the RRC layer 510, the PDCP layer 515, the RLC layer 520, the MAC layer 525, and the PHY layer 530).

Figure 6:
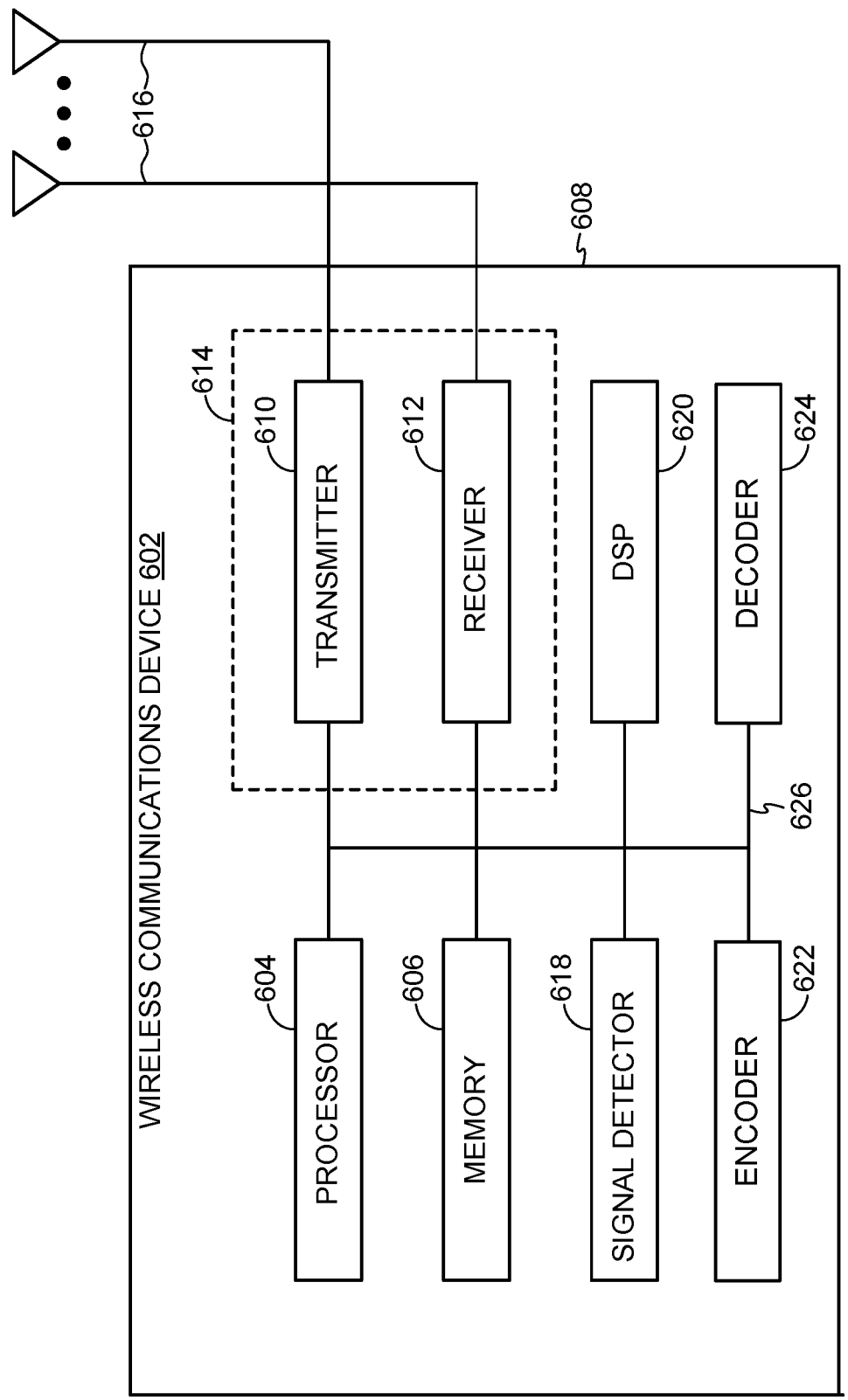
FIG. 6 illustrates a block diagram of an example wireless device in accordance with certain aspects of the present disclosure.

FIG. 6 illustrates various components that may be utilized in a wireless communications device 602 that may be employed within the wireless communication system from FIG. 1. The wireless communications device 602 is an example of a device that may be configured to implement the various methods described herein, for example, for combining decision metrics of a scrambled payload. The wireless communications device 602 may be an BS 110 from FIG. 1 or any of user equipments 120.

The wireless communications device 602 may include a processor 604 which controls operation of the wireless communications device 602. The processor 604 may also be referred to as a central processing unit (CPU). Memory 606, which may include both read-only memory (ROM) and random access memory (RAM), provides instructions and data to the processor 604. A portion of the memory 606 may also include non-volatile random access memory (NVRAM). The processor 604 typically performs logical and arithmetic operations based on program instructions stored within the memory 606. The instructions in the memory 606 may be executable to implement the methods described herein.

The wireless communications device 602 may also include a housing 608 that may include a transmitter 610 and a receiver 612 to allow transmission and reception of data between the wireless communications device 602 and a remote location. The transmitter 610 and receiver 612 may be combined into a transceiver 614. A single or a plurality of transmit antennas 616 may be attached to the housing 608 and electrically coupled to the transceiver 614. The wireless communications device 602 may also include (not shown) multiple transmitters, multiple receivers, and multiple transceivers.

The wireless communications device 602 may also include a signal detector 618 that may be used in an effort to detect and quantify the level of signals received by the transceiver 614. The signal detector 618 may detect such signals as total energy, energy per subcarrier per symbol, power spectral density and other signals. The wireless communications device 602 may also include a digital signal processor (DSP) 620 for use in processing signals.

Additionally, the wireless communications device 602 may also include an encoder 622 for use in encoding signals for transmission. In some cases, the encoder 622 may be configured to perform operations presented herein, for example, with reference to FIG. 11. While encoder 622 is shown as a single encoder, it should be understood that encoder 622 may include one or more encoders (e.g., an outer-code encoder and an inner-code encoder) configured to perform techniques presented herein.

Further, the wireless communications device 602 may include a decoder 624 for use in decoding received signals. In some cases, the decoder 624 may be configured to perform operations presented herein, for example, with reference to FIG. 11. While decoder 624 is shown as a single decoder, it should be understood that decoder 624 may include one or more decoders (e.g., an outer-code decoder and an inner-code decoder) configured to perform techniques presented herein.

The various components of the wireless communications device 602 may be coupled together by a bus system 626, which may include a power bus, a control signal bus, and a status signal bus in addition to a data bus. The processor 604 may be configured to access instructions stored in the memory 606 to perform connectionless access, in accordance with aspects of the present disclosure discussed below.

Figure 7:
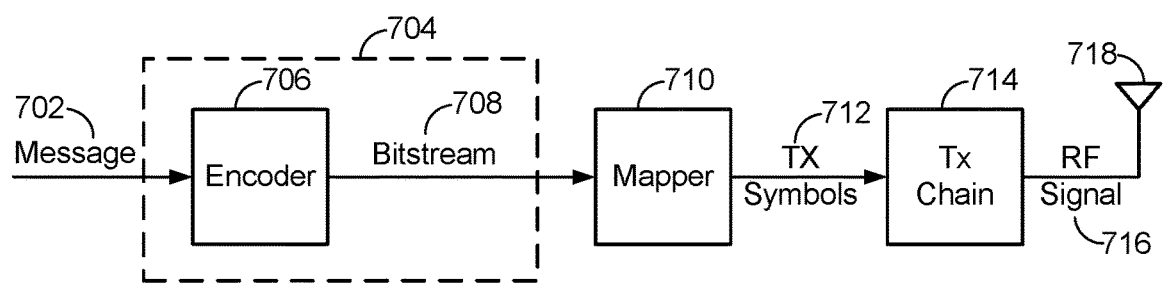
FIG. 7 is a simplified block diagram illustrating a encoder, in accordance with certain aspects of the present disclosure.

FIG. 7 is a simplified block diagram illustrating an encoder, in accordance with certain aspects of the present disclosure. FIG. 7 illustrates a portion of a radio frequency (RF) modem 704 that may be configured to provide an encoded message for wireless transmission (e.g., using polar codes described below). In one example, an encoder 706 (e.g., a polar encoder) in a base station (e.g., BS 110) (or a UE 120 on the reverse path) receives a message 702 for transmission. The message 702 may contain data and/or encoded voice or other content directed to the receiving device. The encoder 706 encodes the message using a suitable modulation and coding scheme (MCS), typically selected based on a configuration defined by the BS 110 or another network entity. In some cases, the encoder 706 may be configured to encode the message 702 using techniques presented herein, for example, with reference to FIG. 11. The encoded bitstream 708 (e.g., representing to the encoded message 702) may then be provided to a mapper 710 that generates a sequence of Tx symbols 712 that are modulated, amplified and otherwise processed by Tx chain 714 to produce an RF signal 716 for transmission through antenna 718.

Figure 8:
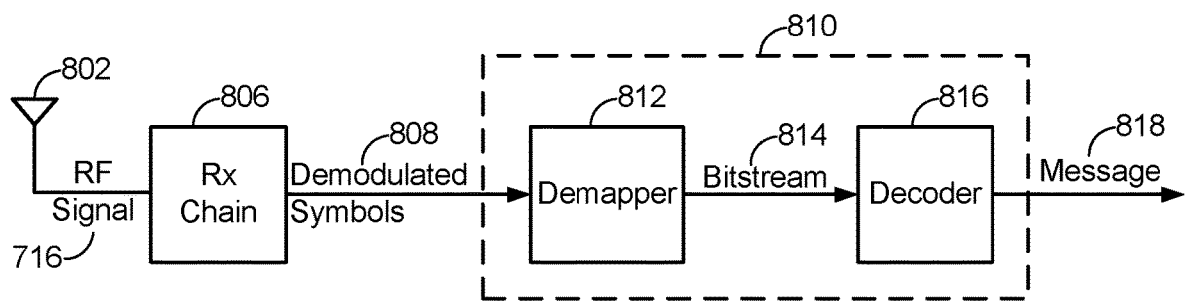
FIG. 8 is a simplified block diagram illustrating a decoder, in accordance with certain aspects of the present disclosure.

FIG. 8 is a simplified block diagram illustrating a decoder, in accordance with certain aspects of the present disclosure. FIG. 8 illustrates a portion of a RF modem 810 that may be configured to receive and decode a wirelessly transmitted signal including an encoded message (e.g., a message encoded using techniques presented herein). In various examples, the modem 810 receiving the signal may reside at the access terminal, at the base station, or at any other suitable apparatus or means for carrying out the described functions. An antenna 802 provides an RF signal 716 (i.e., the RF signal produced in FIG. 4) to an access terminal (e.g., UE 120). An Rx chain 806 processes and demodulates the RF signal 716 and may provide a sequence of symbols 808 to a demapper 812, which produces a sequence of a-priori probabilities, often represented as log-likelihood ratios (LLRs) 814 corresponding to the encoded message.

A decoder 816 may then be used to decode m-bit information strings from a bitstream that has been encoded using a coding scheme (e.g., as described herein). The decoder 816 may comprise a polar decoder, an LDPC decoder, a Viterbi decoder, an algebraic decoder, a butterfly decoder, or another suitable decoder. In one example, a Polar decoder employs the successive cancellation (SC) or successive cancellation list (SCL) decoding algorithm. An SC decoding algorithm essentially operates by performing a recursive depth-first traversal of a decoding tree, to convert the bitstream (e.g., a sequence of LLRs 814) into the message 818 corresponding to the message 702 (e.g., when the decoding is successful).

More specifically, assuming each codeword is of length N, where N must be an integer power of 2 so that $N=2^n$, and that the encoder 706 (e.g., which may be a polar encoder) encodes K information bits into N encoded bits, and rate-matches these to M bits, the LLRs from 814 corresponding to each codeword are first de-ratematched from M bits to N bits by the decoder 816, and a binary tree of depth $n=\log_2(N)$ (e.g., referred to as the decoding tree) is constructed. The root of the tree corresponds to the received vector of N log likelihood ratios (LLRs) to be decoded, and the leaves of the tree correspond to each of the decoded bits, so that N-K of the leaves correspond to the N-K frozen bits (which should decode to the frozen value (zero)), while the remaining K leaves correspond to the K information bits. Let the degree, d, of a node refer to its height above the leaves in the decoding tree, where leaves have d=0 and the root of the tree has $d=\log_2(N)$.

In SC decoding, converting the $2^d$ LLRs corresponding to any node v into the $2^d$ decoded bits corresponding to the $2^d$ leaves of that node (e.g., referred to as decoding node v) is performed via a recursive depth-first traversal of the decoding tree, as follows. For example, the decoder 816 may first use the $2^d$ LLRs corresponding to this node v to calculate the $2^{d-1}$ LLRs corresponding to node v's left child. The decoder 816 may then decode the subcode corresponding to node v's left child. The decoder 816 may then re-encode the length $2^{d-1}$ codeword corresponding to the left child. This partial codeword is referred to as a (left) partial sum. The decoder 816 may then use the partial sum from node v's left child along with the $2^d$ LLRs corresponding to node v to calculate the $2^{d-1}$ LLRs corresponding to v's right child. Thereafter, the decoder 816 may decode the subcode corresponding to node v's right child. Additionally, the decoder 816 may re-encode the length $2^d$ codeword corresponding to the right child and this partial codeword is referred to as a (right) partial sum. Thereafter, the decoder 816 may combine the left and right partial sums to get the partial sum (codeword) corresponding to v.

The above decoding algorithm may be performed recursively starting from the N LLRs at the tree's root node, having degree $d=\log_2(N)$. Applying hard decisions to each (single) LLR at each of the N leaf nodes, after removing the N-K frozen bits, results in the K information bits of the message 818 corresponding to the message 702 (e.g., when the decoding is successful).

In some cases, if an outer code, such as a CRC, were applied before the encoder 706 (e.g., to encode every K' payload bits (e.g., bits of the message 702) into K bits before applying the polar encoder on those K bits to obtain N encoded bits), then an outer code decoder (such as a CRC decoder) would need to be applied to the K information bits output from the decoder 816 to obtain the K' payload bits of the message 818 corresponding to the message 702 (e.g., when the decoding is successful).

Note that in SC decoding, a single bit, corresponding to a single data leaf node, is decoded at a time; the vector of bits that have already been decoded will be referred to as the "decoder history." In SCL decoding, a list of the "best" L paths is maintained, where a path is defined as a decoder history, and the notion of "best" is based off computing a path metric corresponding to a given decoder history. The basic SCL algorithm is similar to SC, and the decoding tree and tree traversal are identical, except that the tree traversal algorithm described for SC above occurs in parallel for all L paths.

In SCL decoding, whenever a data leaf node is encountered, each of the incoming L paths is split into 2 paths, resulting in 2L paths. The first L of those 2L paths are derived by decoding according to the sign of the LLR corresponding to each incoming path, as would be done in SC decoding; these L paths are therefore referred to as SC paths. The remaining L paths are copies of the first L paths, but with the last bit of the decoder history inverted, so that these paths decode according to the inverse of the sign of the LLR corresponding to each incoming path. Therefore, these L paths may be referred to as inverted paths. The path metrics of the L SC paths are unchanged, but the path metrics of the inverted paths are penalized by the magnitude of the corresponding LLR (which has been inverted). The 2L path metrics are then sorted, and the tree traversal resumes with the best L paths. When no outer code is present, message 818 corresponds to the decoded bits corresponding to the path having the best path metric. When an outer code was first applied to the K' payload bits of the message 702 to obtain the K bits input to the encoder 706, an outer code decoder, for example a CRC decoder, may be applied to the decoded bits of each of the L paths, and message 818 is the set of decoded bits which satisfy the outer code decoder (for example, the vector of decoded bits that pass the CRC check).

Figure 9:
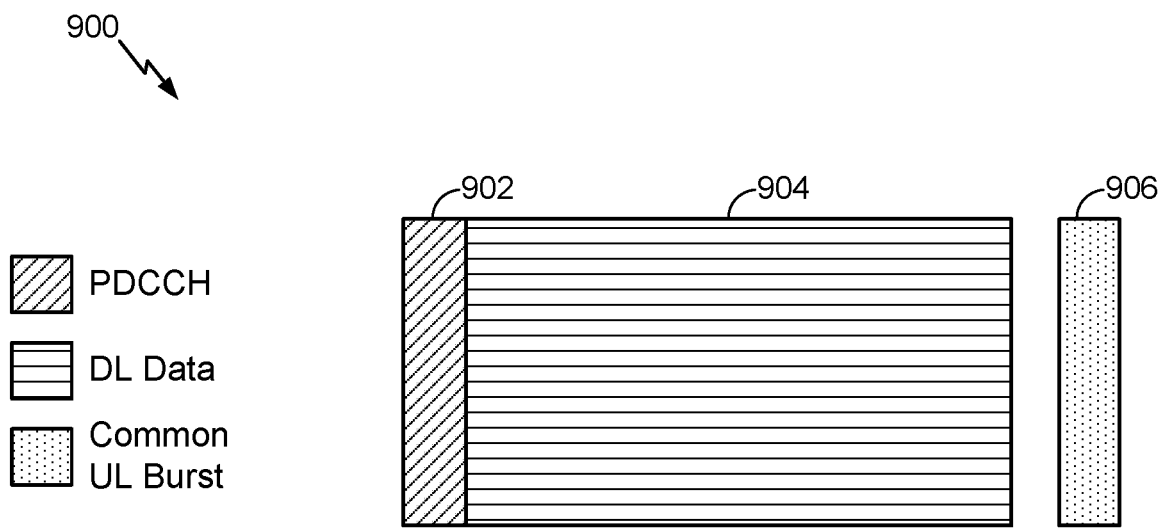
FIG. 9 illustrates an example of a DL-centric subframe, in accordance with certain aspects of the present disclosure.

FIG. 9 is a diagram 900 showing an example of a DL-centric subframe, which may be used by one or more devices (e.g., BS 110 and/or UE 120) to communicate in the wireless network 100. The DL-centric subframe may include a control portion 902. The control portion 902 may exist in the initial or beginning portion of the DL-centric subframe. The control portion 902 may include various scheduling information and/or control information corresponding to various portions of the DL-centric subframe. In some configurations, the control portion 902 may be a physical DL control channel (PDCCH), as indicated in FIG. 9. The DL-centric subframe may also include a DL data portion 904. The DL data portion 904 may sometimes be referred to as the payload of the DL-centric subframe. The DL data portion 904 may include the communication resources utilized to communicate DL data from the scheduling entity (e.g., UE or BS) to the subordinate entity (e.g., UE). In some configurations, the DL data portion 904 may be a physical DL shared channel (PD SCH).

The DL-centric subframe may also include a common UL portion 906. The common UL portion 906 may sometimes be referred to as an UL burst, a common UL burst, and/or various other suitable terms. The common UL portion 906 may include feedback information corresponding to various other portions of the DL-centric subframe. For example, the common UL portion 906 may include feedback information corresponding to the control portion 902. Non-limiting examples of feedback information may include an ACK signal, a NACK signal, a HARQ indicator, and/or various other suitable types of information. The common UL portion 906 may include additional or alternative information, such as information pertaining to random access channel (RACH) procedures, scheduling requests (SRs), and various other suitable types of information. As illustrated in FIG. 9, the end of the DL data portion 904 may be separated in time from the beginning of the common UL portion 906. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 10:
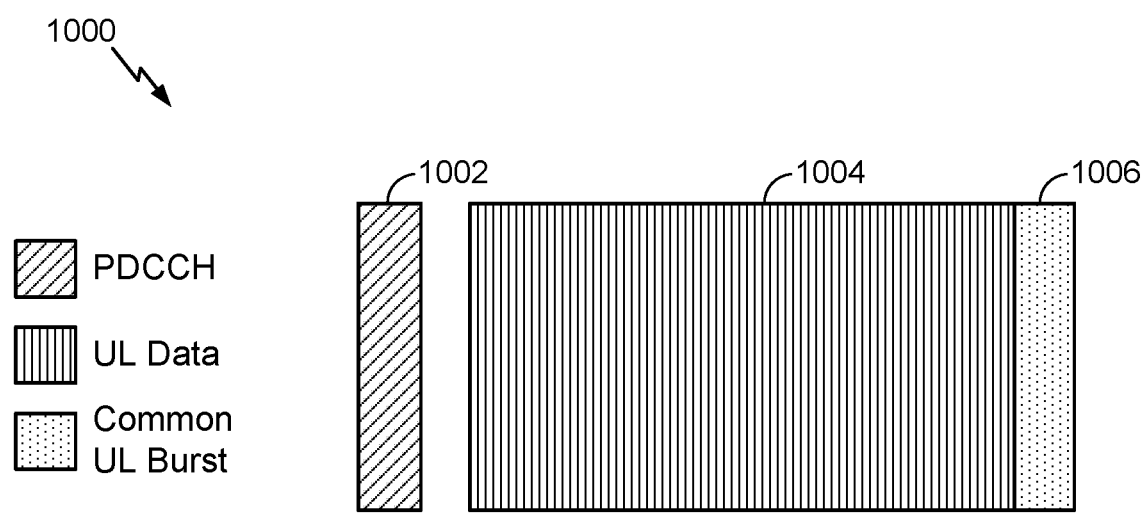
FIG. 10 illustrates an example of an UL-centric subframe, in accordance with certain aspects of the present disclosure.

FIG. 10 is a diagram 1000 showing an example of an UL-centric subframe, which may be used by one or more devices (e.g., BS 110 and/or UE 120) to communicate in the wireless network 100. The UL-centric subframe may include a control portion 1002. The control portion 1002 may exist in the initial or beginning portion of the UL-centric subframe. The control portion 1002 in FIG. 10 may be similar to the control portion described above with reference to FIG. 9. The UL-centric subframe may also include an UL data portion 1004. The UL data portion 1004 may sometimes be referred to as the payload of the UL-centric subframe. The UL portion may refer to the communication resources utilized to communicate UL data from the subordinate entity (e.g., UE) to the scheduling entity (e.g., UE or BS). In some configurations, the control portion 1002 may be a physical DL control channel (PDCCH).

As illustrated in FIG. 10, the end of the control portion 1002 may be separated in time from the beginning of the UL data portion 1004. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 1006. The common UL portion 1006 in FIG. 10 may be similar to the common UL portion 1006 described above with reference to FIG. 10. The common UL portion 1006 may additional or alternative include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Polar Codes

Polar codes are a relatively recent breakthrough in coding theory, which have been proven to asymptotically (for code size N approaching infinity) achieve the Shannon capacity. Polar codes have many desirable properties such as deterministic construction (e.g., based on a fast Hadamard transform), very low and predictable error floors, and simple successive-cancellation (SC) based decoding. They are currently being considered as a candidate for error-correction in next-generation wireless systems such as NR.

Polar codes are linear block codes of length $N=2^n$ where their generator matrix is constructed using the nth Kronecker power of the matrix $$G = \begin{pmatrix} 1 & 0 \\ 1 & 1 \end{pmatrix},$$

denoted by $G^n$. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. 1}$$

According to certain aspects, a codeword may be generated (e.g., by encoder 706) by using the generator matrix to encode a number of input bits consisting of K information bits and N-K "frozen" bits which contain no information and are "frozen" to a known value, such as zero. For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be rate matched and transmitted by a base station over a wireless medium and received by a UE.

When the received vectors are decoded, for example by using a Successive Cancellation (SC) decoder (e.g., decoder 816), every estimated bit, $\hat{u}_i$, has a predetermined error probability given that bits $u_0^{i-1}$ were correctly decoded, that, for extremely large codesize N, tends towards either 0 or 0.5. Moreover, the proportion of estimated bits with a low error probability tends towards the capacity of the underlying channel. Polar codes exploit this phenomenon, called channel polarization, by using the most reliable K bits to transmit information, while setting to a predetermined value (such as 0), also referred to as freezing, the remaining (N-K) bits, for example as explained below.

Polar codes transform the channel into N parallel "virtual" channels for the N information and frozen bits. If C is the capacity of the channel, then, for sufficiently large values of N, there are almost N*C channels which are extremely reliable and there are almost N(1-C) channels which are extremely unreliable. The basic polar coding scheme then involves freezing (i.e., setting to a known value, such as zero) the input bits in u corresponding to the unreliable channels, while placing information bits only in the bits of u corresponding to reliable channels. For short-to-medium N, this polarization may not be complete in the sense there could be several channels which are neither completely unreliable nor completely reliable (i.e., channels that are marginally reliable). Depending on the rate of transmission, bits corresponding to these marginally reliable channels may be either frozen or used for information bits.

Example Combining Decision Metrics of a Scrambled Payload

In certain cellular communications technologies (e.g., long term evolution (LTE)), payload data transmitted on channel such as a physical broadcast channel (PBCH) may be sent over multiple successive frames. At a receiver, the payload data received over multiple transmissions (e.g., decision metrics, such as log likelihood ratios (LLRs)) may be combined to improve the decoding performance of later received frames of data. To distinguish between multiple transmissions, extra bits are allocated in a frame to indicate a System Frame Number (SFN).

A basic scheme for combining decision metrics, known as a delta scheme, has been proposed for decoding based on differences in payloads transmitted over multiple successive frames. For example, in 4G LTE, a payload transmitted on the PBCH may be scrambled after Tail-Biting Convolutional Coding (TBCC) encoding and transmitted to a receiving device (e.g., a UE). At the receiver, in the delta scheme, the payload received on the PBCH may be combined over multiple transmissions by simply descrambling the (current) payload and adding it to the previously saved descrambled payload of a previous transmission. For example, the delta scheme involves taking the difference between the payloads of two successive transmissions (i.e., the delta) and canceling the impact of the delta bits on current transmission LLRs. Thereafter, HARQ combining of current and previous transmission LLRs may be performed to improve the decoding performance.

In 5G NR, however, the payload is scrambled both before and after polar encoding, and thus, combining scrambled payloads over multiple transmissions before decoding requires a different approach than used in 4G LTE.

Accordingly, aspects of the present disclosure propose techniques for allowing the combining of payloads over multiple transmissions in 5G NR. For example, in some cases, combining of payloads over multiple transmissions in 5G NR may involve generating and encoding a payload at a receiver which includes a plurality of payload mask bits that are selectively set. The payload generated and encoded at the receiver may then be used to remove (e.g., descramble) an impact in LLRs received over a wireless medium at a receiver. For example, the received LLRs may correspond to bits of information that were scrambled both before (e.g., first scrambling) and after (e.g., second scrambling) encoding at a transmitter. At the receiver, a second payload generated and encoded at the receiver may be used to remove (e.g., descramble) the impact of the first scrambling in the received LLRs that occurs before the bits of information were encoded at the transmitter. By removing the impact of the first scrambling in the received LLRs, the receiver may be able to combine multiple 5G NR transmissions, thereby improving decoding performance.

Figure 11:
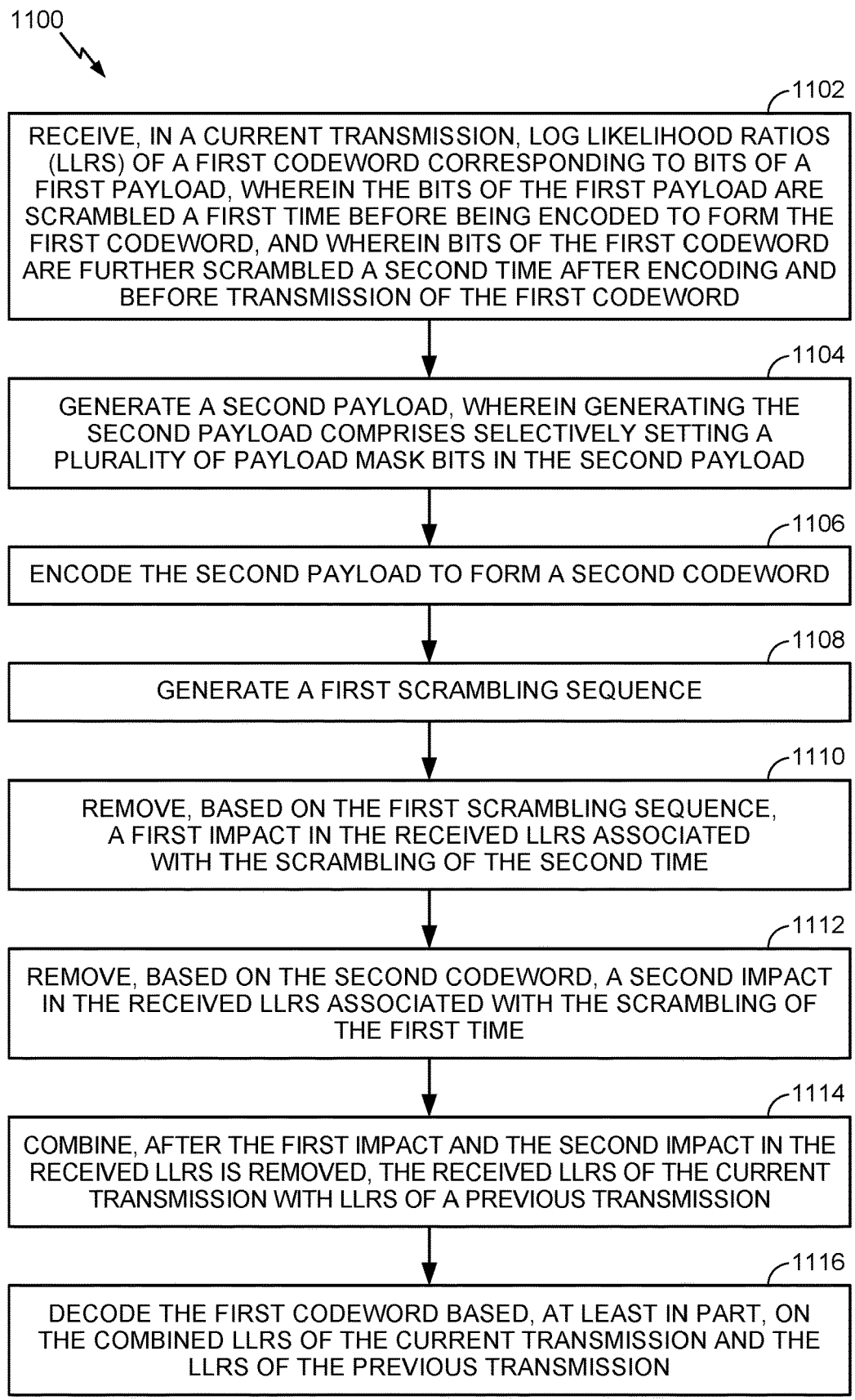
FIG. 11 illustrates example operations for combining decision metrics of a scrambled payload, in accordance with certain aspects of the present disclosure.

FIG. 11 illustrates example operations for combining decision metrics of a scrambled payload, in accordance with certain aspects of the present disclosure. In some cases, operations 1110 may be used to improve decoding performance of a physical broadcast channel (PBCH) in a 5G system. According to certain aspects, operations 1100 may, for example, be performed by any suitable wireless communications device, such as a base station (e.g., 110), user equipment (e.g., UE 120), and/or wireless communications device 602.

The wireless communications device may include one or more components as illustrated in FIGS. 4 and 6 which may be configured to perform the operations described herein. For example, the antenna 434, modulator/demodulator 432, transmit processor 420, controller/processor 440, and/or memory 442 of the base station 110, as illustrated in FIG. 4, may perform the operations described herein. Additionally or alternatively, the antenna 452, demodulator/modulator 454, transmit processor 464, controller/processor 480, and/or memory 482 of the user equipment 120, as illustrated in FIG. 4, may perform the operations described herein. Additionally or alternatively, one or more of the processor 604, memory 606, transceiver 614, DSP 320, encoder 622, decoder 620, and/or antenna(s) 616 as illustrated in FIG. 6 may be configured to perform the operations described herein.

Operations 1100 begin at 1102 by receiving, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword.

At 1104, the wireless communications device generates, in response to receiving the current transmission, a second payload, wherein generating the second payload comprises selectively setting a plurality of payload mask bits in the second payload.

At 1106, the wireless communications device encodes the second payload to form a second codeword. For example, in some cases, the wireless communications device may encode the second payload using a polar code.

At 1108, the wireless communications device generates a first scrambling sequence. In some cases, the first scrambling sequence may comprise a pseudo-random sequence defined by a length-31 Gold sequence generator, which may be initialized based on a Cell ID of the cell that transmitted the current transmission.

At 1110, the wireless communications device removes, based on the first scrambling sequence, a first impact in the received LLRs associated with the scrambling of the second time. In some cases, removing the first impact in the received LLRs comprises descrambling the LLRs to remove the scrambling of the second time (e.g., the scrambling of the bits of the first codeword that were further scrambled a second time after encoding and before transmission of the first codeword corresponding to the received LLRs).

At 1112, the wireless communications device removes, based on the second codeword, a second impact in the received LLRs associated with the scrambling of the first time. In some cases, removing the second impact in the received LLRs comprises descrambling the LLRs to remove the scrambling of the first time (e.g., the scrambling of the bits of the first payload that were scrambled a first time before being encoded to form the first codeword).

At 1114, the wireless communications device combines, after the first impact and the second impact in the received LLRs are removed, the received LLRs of the current transmission with LLRs of a previous transmission. According to aspects, LLRs of the previous transmission have also been processed in the same manner as the LLRs of the current transmission. That is, after being received at the wireless communications device, the LLRs of the previous transmission have also been processed to remove the impact of scrambling occurring before (e.g., first time) and after (e.g., second time) encoding at a transmitter.

At 1116, the wireless communications device decodes the first codeword based, at least in part, on the combined LLRs of the current transmission and the LLRs of the previous transmission.

As noted, aspects of the present disclosure propose techniques for allowing the combining of payloads over multiple transmissions (e.g., PBCH transmissions) in 5G NR. Table 1, below, shows a basic frame structure of the PBCH in 5G NR.

TABLE 1

| PBCH Structure in 5G NR | | | |
|---|---|---|---|
| X bits | 11 bits | 3 bits | 24 bits |
| Other MIB bits | S9, S8, . . . , S0, C0 | b5, b4, b3 | CRC |

In 4G LTE, a same payload is transmitted on four 10 ms frames that are to be combined across 40 ms, whereas in 5G NR, a different payload is transmitted on four 20 ms frames. As a result, in 5G NR, only master information block (MIB) bits are same across the different payloads and the remaining payload bits are different. As shown in Table 1, the bits that may differ between transmissions in 5G NR are the payload mask bits (i.e., hypothesis index bits) S9-S0, C0, b5-b3. Bits b2-b0 are also part of hypothesis index and are obtained from secondary synchronization signal (SSS) decoding. In 5G NR, within a 20 ms transmission there are four 5 ms burst-sets. Bits S0 and C0 are used to distinguish 5 ms burst-sets in a 20 ms frame. Multiple bursts within a burst-set are distinguished using bits b5-b0 and bits S2 and S1 are used to index the 20 ms transmissions. Bits S9-S3 are used to index the 80 ms transmissions.

Since in 5G NR payload bits are scrambled both before and after encoding, the impact of the pre-encoding scrambling may not be removed using existing techniques. However, aspects of the present disclosure propose techniques to allow for removing the impact of the scrambling before the encoding process. For example, in some cases, removing the scrambling before the encoding process may involve receiving, at a wireless communications device (e.g., a receiver), a current transmission corresponding to a first payload that was scrambled a first time before encoding and also scrambled a second time after the encoding. According to aspects, the first payload may include a first plurality of payload mask bits, for example, as described above.

Further, the wireless communications device may generate a second payload and selectively set a second plurality of payload mask bits in the second payload (e.g., to try to match the payload mask bits that were set in first payload). According to aspects, the wireless communications device may then encode the second payload (e.g., using a Polar code) and may attempt to use the selectively set payload mask bits in the second payload to remove the impact of the first plurality of payload mask bits in the first payload (e.g., the scrambling occurring before encoding). According to aspects, once the impact of the first plurality of payload mask bits in the first payload of the current transmission has been removed, the current transmission may be combined with a previous transmission and used to decode a codeword. Aspects of the present disclosure will now provide a more in-depth discussion of this process with respect to FIG. 12.

Figure 12:
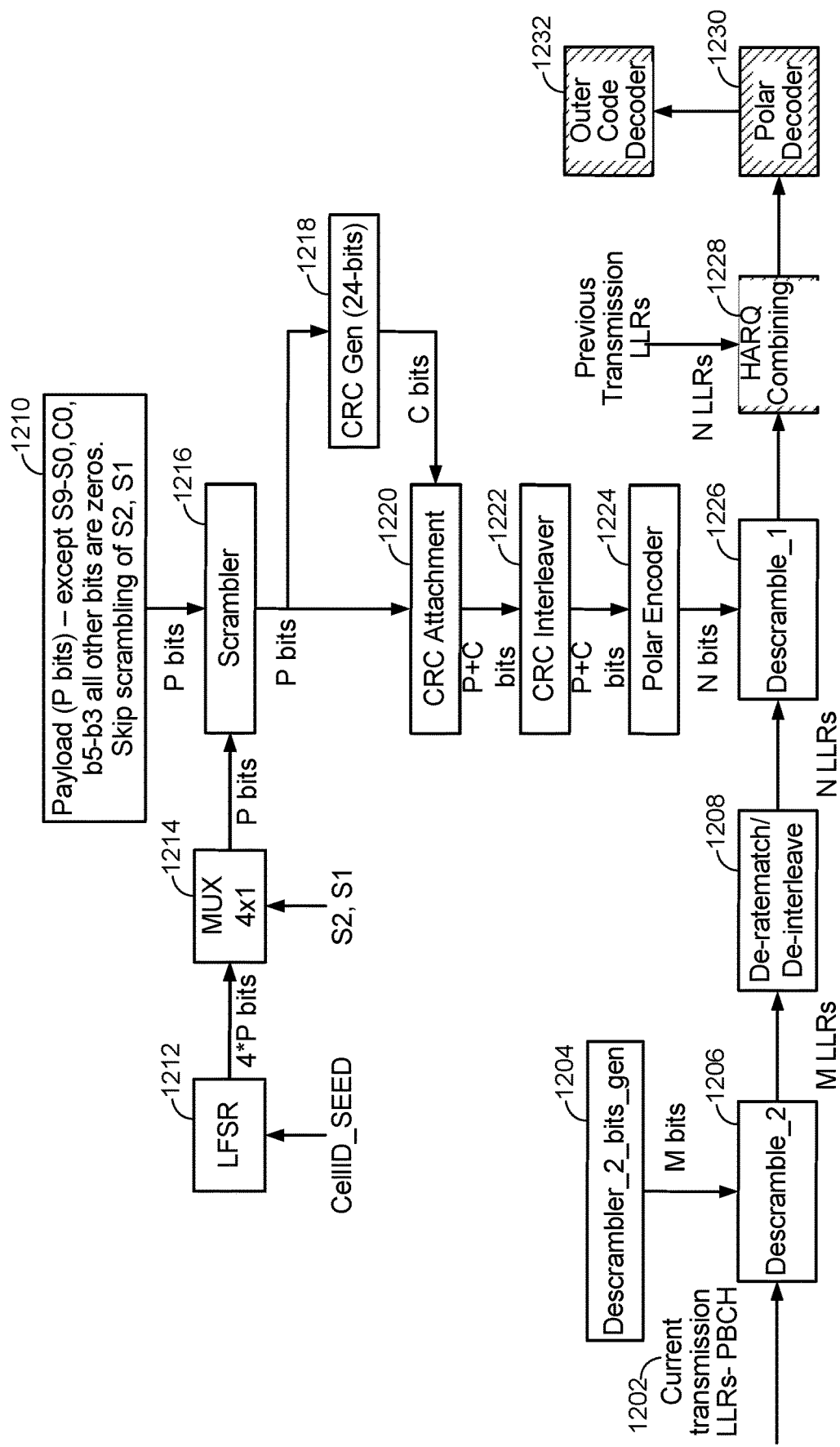
FIG. 12 is a block diagram illustrating techniques for combining decision metrics of a scrambled payload, in accordance with certain aspects of the present disclosure.

FIG. 12 is a block diagram illustrating techniques for combining transmissions at a wireless communications device in a 5G NR system to improve the decoding performance of later-received frames, according to certain aspects of the present disclosure. According to aspects, the block/techniques illustrated in FIG. 12 may be implemented by a wireless communication device, such as a base station (e.g., 110), user equipment (e.g., UE 120), and/or wireless communications device 602.

As illustrated, at 1202, the wireless communications device (e.g., a receiver, such as UE 120) may receive a current transmission, comprising a plurality of LLRs of a first codeword, from a transmitting device (e.g., BS 110). According to aspects, the plurality of LLRs may correspond to bits of a first payload that were scrambled a first time before being encoded to form the first codeword and that was then further scrambled a second time after encoding and before transmission of the (scrambled) first codeword. According to aspects, the current transmission may correspond to a PBCH payload that includes a first plurality of payload mask bits, for example, as described above with respect to Table 1. The first plurality of payload mask bits may be selectively set by the transmitting device, the particular setting of which may be unknown to the receiving wireless communications device. Additionally, the first codeword may include a CRC generated based on bits of the first payload. According to aspects and as will be described in greater detail below, the CRC included in the first codeword may be used to determine whether the first codeword is decoded correctly in view of the payload combining process described herein.

At 1204, the wireless communications device may generate a pseudo-random sequence $c_0, c_1, c_2, c_{M-1}$ of length 8M (e.g., for 5G NR M=864), for example, using a Linear Feedback Shift Register (LFSR). In some cases, the pseudo-random sequence may be defined by a length-31 Gold sequence generator, which may be initialized based on a Cell ID of the cell that transmitted the current transmission. Additionally, bits b0, b1 and b2 may be obtained from secondary synchronization signal (SSS) decoding and may be used by the wireless communications device to select sequence of length M out of 8*M length sequence.

At 1206, the wireless communications device may use this pseudo-random sequence to remove an impact of the scrambling in the received LLRs associated with the scrambling that occurred after the payload bits (corresponding to the received LLRs) were encoded (i.e., the scrambling associated with the second time). According to aspects, the output sequence of the descrambling at 1206 may be based on the following algorithm:

---
for i = 0 to M − 1
  if $c_i = 0$
    $r'_i = r_i$
  else $c_i = 1$
    $r'_i = (−1 * r_i)$
  end
end
---

At 1208, the wireless communications device may de-rate match and de-interleave the descrambled LLRs. According to aspects, de-rate matching may involve reducing the number of LLRs from M to N where de-interleaving re-orders the LLRs from interleaved order to sequential order. Additionally, it should be noted that the de-interleaving operation may be performed on LLRs of length N.

At 1210, the wireless communications device may generate a second payload of length P and selectively set a second plurality of payload mask bits in the second payload (e.g., to try to match the payload mask bits that were set in the first payload). For example, the wireless communications device may selectively set the second plurality payload mask bits in the second payload corresponding to bit indices s9-s0, c0, and b5-b3. All other bits in the second payload may be set to zero.

At 1212, the wireless communications device generates (e.g., using a linear-feedback shift register (LFSR)) a second pseudo-random sequence defined by a length-31 Gold sequence generator. In some cases, the second pseudo-random sequence may be based on a Cell ID of the cell that transmitted the current transmission. According to aspects, the output sequence c(n) of length $M_{PN}$, where n=01, ..., $M_{PN}$−1, may be defined by:

$c(n)=(x_1(n+N_c)+x_2(n+N_c)) \bmod 2$ $x_1(n+31)=(x_1(n+3)+x_1(n)) \bmod 2$ $x_2(n+31)=(x_2(n+3)+x_2(n+2)+x_2(n+1)+x_2(n)) \bmod 2$ where $N_c$=1600 and the first m-sequence may be initialized with $x_1(0)=1$, $x_1(n)=0$, n=1, 2, ..., 30. Further, the initialization of the second m-sequence may be denoted by $c_{init}=\Sigma_{i=0}^{30} x_2(i) \cdot 2^i$ with the value depending on the application of the sequence. According to aspects, the second pseudo-random sequence may be generated as length 4*P.

At 1214, the wireless communications device selects (e.g., using a MUX) a sequence of length P for example, from the second pseudo-random sequence of length 4P based on S2, S1 bits in the second payload (e.g., which were selectively set at 1210. For example, the wireless communications device may select the sequence of length P based on Table 2, below.

TABLE 2

N Sequence Selection Based on S2 and S1

| S2, S1 | Sequence |
|---|---|
| 0, 0 | 0 to P1 |
| 0, 1 | P to 2P − 1 |
| 1, 0 | 2P to 3P − 1 |
| 1, 1 | 3P to 4P − 1 |

At 1216, the wireless communications device scrambles (e.g., using a bit-wise XOR operation) the second payload generated at 1210 using the second pseudo-random sequence generated/selected at 1212 and 1214. According to aspects, mask bits b5-b3, c0, s2 and s1 in the second payload may be skipped from scrambling.

At 1218, the wireless communications device generates a cyclic redundancy check (CRC) sequence based on the scrambled output of 1216. At 1220 and 1222, the CRC may be attached and interleaved with the scrambled output of 1216 to form an information sequence (including bits of the second payload generated at 1210 and bits of the CRC generated at 1218). According to certain aspects, the interleaving may be performed according to a pre-defined pattern.

At 1224, the wireless communications device encodes the information sequence (including bits of the second payload generated at 1210 and bits of the CRC generated at 1218) using a polar code, for example, using techniques described above.

At 1226, based on the output of 1224, the wireless communications device removes the impact (e.g., descrambles) of the scrambling in the received LLRs, corresponding to the first payload, associated with the scrambling (at the transmitter) occurring before the first payload was encoded (i.e., the scrambling associated with the first time). For example, based on the output of 1224, the wireless communications device may remove the impact associated with payload mask bits in the received LLRs using the plurality of selectively set payload mask bits in the second payload. For example, the plurality of selectively-set payload mask bits may be used by the descrambler at 1226 to derive a plurality of descrambler bits, which are then used to perform the descrambling on the received LLRs (e.g., as noted, to remove the impact of the scrambling of the payload bits at the transmitter occurring before the first payload was encoded).

At 1228, after the impact associated with the scrambling of the first time and the scrambling of the second time is removed from the received LLRs of the current transmission, the LLRs of the current transmission may be combined with LLRs of a previous transmission (e.g., that have been processed using the steps described above). For example, the combining, known as hybrid automatic repeat request (HARQ) combining, may involve the addition of LLRs of length N received in the current transmission with the respective LLRs received in the previous transmission. For example, assuming an LLR width of Q-bits, N LLRs from a current transmission may be combined with N LLRs from a previous transmission in a one-to-one addition. For example, LLR0 from a current transmission may be added to LLR0 of a previous transmission and LLR1 from the current transmission may be added to LLR1 of the previous transmission, etc. Hence, the output of the addition is of length N-LLRs. For example, let a=[a(0), a(1), . . . , a(N−1)] be the current transmission LLRs. Additionally, let b=[b(0), b(1), b(N)] be the previous transmission LLRs. Finally, let c=[c(0), c(1), c(N)] is the result of HARQ combining. According to aspects, the HARQ combining may be performed according to the following algorithm:

```
for i=0:N−1
    c(i) = a(i) + b(i)
end
```

At 1230, the wireless communications device may decode the first codeword (e.g., corresponding to the LLRs received at 1202) based, at least in part, on the combined LLRs of the current transmission and the LLRs of the previous transmission.

At 1232, the output of block 1230 (e.g., the decoded first codeword) may then be input into an outer code decoder. According to aspects, the wireless communications device may process the decoded first codeword at 1232 to determine whether a CRC included in the decoded first codeword (i.e., the first payload corresponding to the decoded first codeword) passes a CRC check or not. According to aspects, if the CRC included in the decoded first codeword passes, the payload combining techniques may be assumed to be successful by the wireless communications device.

If, however, the CRC included in the decoded first codeword fails to pass the CRC check, the wireless communications device may return to block 1210 and repeat the generation of the second payload and selectively set the second plurality payload mask bits in the second payload to values different from a previous second payload (e.g., again trying to match those mask bits set in the first payload). According to aspects, a CRC included in the decoded first codeword may fail to pass the CRC check due to the second plurality of payload mask bits not being set to correct values (e.g., values that do not match the values of the first plurality of payload mask bits in the first payload). Thus, the techniques described in blocks 1210-1232 may be performed repeatedly, each time with different values for the second plurality of payload mask bits in the second payload, until the CRC included in the decoded first payload passes the CRC check (e.g., implying that the second plurality of payload mask bits in the second payload are correctly set to match the first plurality of payload mask bits in the first payload). As noted, when the CRC included in the decoded first codeword passes, the payload combining techniques may be assumed to be successful by the wireless communications device.

According to aspects, the techniques described above provide a way to combine payload that is scrambled pre-encoding and transmitted over multiple transmissions. According to aspects, the combining aids in leveraging diversity and energy combining gain and thus improves the decoding performance in the wireless communication device. For example, in NR 5G, the techniques described above may be used to improve the decoding performance of PBCH (or any other type of channel whose transmitted payloads are scrambled before and after encoding). Further, the combining scheme proposed above is a non-delta scheme. Unlike the delta scheme described above, the non-delta scheme does not require the need to compute difference in payload between two transmissions for HARQ combining. Thus, hardware/firmware implementation complexity at the wireless communications device may be reduced.

It should be understood that, while aspects of the present disclosure propose techniques for combining payloads in a wireless communication system, the techniques presented herein are not limited to such wireless communication system. For example, the techniques presented herein may equally apply to any other system that uses encoding schemes, such as data storage or compression, or fiber communication systems, hard-wire "copper" communication systems, and the like. Additionally, while techniques presented herein are generally directed to payload combining of information transmitted on a PBCH, it should be understood that these techniques may be equally applied to any type of information transmitted on any type of channel that is scrambled at a transmitter before encoding of the information.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting, means for receiving, means for determining, means for generating, means for encoding, means for decoding, means for removing, means for combining, means for using, means for scrambling, means for de-scrambling, means for including, means for checking, and/or means for repeating may comprise one or more processors or antennas at the BS 110 or UE 120, such as the transmit processor 420, controller/processor 440, receive processor 438, or antennas 434 at the BS 110 and/or the transmit processor 464, controller/processor 480, receive processor 458, or antennas 452 at the UE 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user equipment 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method of wireless communications performed at a receiving device, comprising:
receiving, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword;
generating, in response to receiving the current transmission, a second payload, wherein generating the second payload comprises selectively setting a plurality of payload mask bits in the second payload;
encoding the second payload to form a second codeword;
generating a first scrambling sequence;
removing, based on the first scrambling sequence, a first impact in the received LLRs associated with the scrambling of the second time;
removing, based on the second codeword, a second impact in the received LLRs associated with the scrambling of the first time;
combining, after the first impact and the second impact in the received LLRs is removed, the received LLRs of the current transmission with LLRs of a previous transmission; and
decoding the first codeword based, at least in part, on the combined LLRs of the current transmission and the LLRs of the previous transmission.

2. The method of claim 1, wherein removing the second impact comprises removing an impact associated with payload mask bits in the received LLRs using the selectively-set plurality of payload mask bits.

3. The method of claim 1, wherein generating the first scrambling sequence comprising generating the first scrambling sequence using a gold sequence generator with an initial seed based on a cell ID.

4. The method of claim 1, wherein encoding the second payload to form the second codeword further comprises:
generating a second scrambling sequence; and
using the second scrambling sequence to scramble the second payload before encoding the second payload.

5. The method of claim 4, wherein the second scrambling sequence is generated using a gold sequence generator with an initial seed based on a cell ID.

6. The method of claim 4, wherein the plurality of payload mask bits in the second payload correspond to bit indices S9-S3, S2, S1, S0, C0, and b5-b3 in the second payload.

7. The method of claim 6, wherein mask bits corresponding to bit indices S1, S2, C0, b3, b4 and b5 in the second payload are not scrambled when scrambling the second payload.

8. The method of claim 4, wherein encoding the second payload to form the second codeword further comprises:
generating a cyclic redundancy check (CRC) based on the second payload; and
including the CRC in the second payload.

9. The method of claim 1, wherein the first payload and the second payload are encoded using a polar code.

10. The method of claim 1, wherein generating the second payload further comprises setting a remaining number of bits not included in the plurality of payload mask bits in the second payload to zero.

11. The method of claim 1, further comprising:
checking a cyclic redundancy check (CRC) associated with the first codeword; and
if the CRC associated with the first code word does not pass, repeating generation of the second payload and setting a second plurality of payload mask bits in the second payload to values different from a previous generation of the second payload until the CRC associated with the first codeword passes.

12. An apparatus for wireless communications performed at a receiving device, comprising:

at least one processor configured to:
receive, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword;
generate, in response to receiving the current transmission, a second payload, wherein generating the second payload comprises selectively setting a plurality of payload mask bits in the second payload;
encode the second payload to form a second codeword;
generate a first scrambling sequence;
remove, based on the first scrambling sequence, a first impact in the received LLRs associated with the scrambling of the second time;
remove, based on the second codeword, a second impact in the received LLRs associated with the scrambling of the first time;
combine, after the first impact and the second impact in the received LLRs is removed, the received LLRs of the current transmission with LLRs of a previous transmission; and
decode the first codeword based, at least in part, on the combined LLRs of the current transmission and the LLRs of the previous transmission; and
a memory coupled with the at least one processor.

13. The apparatus of claim 12, wherein the at least one processor is configured to remove the second impact by removing an impact associated with payload mask bits in the received LLRs using the selectively-set plurality of payload mask bits.

14. The apparatus of claim 12, wherein the at least one processor is configured to generate the first scrambling sequence using a gold sequence generator with an initial seed based on a cell ID.

15. The apparatus of claim 12, wherein the at least one processor is configured to encoding the second payload to form the second codeword by:
generating a second scrambling sequence; and
using the second scrambling sequence to scramble the second payload before encoding the second payload.

16. The apparatus of claim 15, wherein the at least one processor is configured to generate the second scrambling sequence using a gold sequence generator with an initial seed based on a cell ID.

17. The apparatus of claim 15, wherein the plurality of payload mask bits in the second payload correspond to bit indices S9-S3, S2, S1, S0, C0, and b5-b3 in the second payload.

18. The apparatus of claim 17, wherein mask bits corresponding to bit indices S1, S2, C0, b3, b4 and b5 in the second payload are not scrambled when scrambling the second payload.

19. The apparatus of claim 15, wherein the at least one processor is further configured to encode the second payload to form the second codeword by:
generating a cyclic redundancy check (CRC) based on the second payload; and
including the CRC in the second payload.

20. The apparatus of claim 12, wherein the first payload and the second payload are encoded using a polar code.

21. The apparatus of claim 12, wherein the at least one processor is further configured to generate the second payload by setting a remaining number of bits not included in the plurality of payload mask bits in the second payload to zero.

22. The apparatus of claim 12, wherein the at least one processor is further configured to:
check a cyclic redundancy check (CRC) associated with the first codeword; and
if the CRC associated with the first code word does not pass, repeat generation of the second payload and setting a second plurality of payload mask bits in the second payload to values different from a previous generation of the second payload until the CRC associated with the first codeword passes.

23. An apparatus for wireless communications performed at a receiving device, comprising:
means for receiving, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword;
means for generating, in response to receiving the current transmission, a second payload, wherein generating the second payload comprises selectively setting a plurality of payload mask bits in the second payload;
means for encoding the second payload to form a second codeword;
means for generating a first scrambling sequence;
means for removing, based on the first scrambling sequence, a first impact in the received LLRs associated with the scrambling of the second time;
means for removing, based on the second codeword, a second impact in the received LLRs associated with the scrambling of the first time;
means for combining, after the first impact and the second impact in the received LLRs is removed, the received LLRs of the current transmission with LLRs of a previous transmission; and
means for decoding the first codeword based, at least in part, on the combined LLRs of the current transmission and the LLRs of the previous transmission.

24. The apparatus of claim 23, wherein the means for removing the second impact comprises means for removing an impact associated with payload mask bits in the received LLRs using the selectively-set plurality of payload mask bits.

25. The apparatus of claim 23, wherein the means for generating the first scrambling sequence comprising means for generating the first scrambling sequence using a gold sequence generator with an initial seed based on a cell ID.

26. The apparatus of claim 23, wherein the means for encoding the second payload to form the second codeword further comprises: means for generating a second scrambling sequence; and means for using the second scrambling sequence to scramble the second payload before encoding the second payload.

27. The apparatus of claim 26, wherein the second scrambling sequence is generated using a gold sequence generator with an initial seed based on a cell ID.

28. The apparatus of claim 26, wherein the plurality of payload mask bits in the second payload correspond to bit indices S9-S3, S2, S1, S0, C0, and b5-b3 in the second payload.

29. The apparatus of claim 28, wherein mask bits corresponding to bit indices S1, S2, C0, b3, b4 and b5 in the second payload are not scrambled when scrambling the second payload.

30. The apparatus of claim 26, wherein the means for encoding the second payload to form the second codeword further comprises:
  means for generating a cyclic redundancy check (CRC) based on the second payload; and
  means for including the CRC in the second payload.

31. The apparatus of claim 23, wherein the first payload and the second payload are encoded using a polar code.

32. The apparatus of claim 23, wherein the means for generating the second payload further comprises means for setting a remaining number of bits not included in the plurality of payload mask bits in the second payload to zero.

33. The apparatus of claim 23, further comprising:
  means for checking a cyclic redundancy check (CRC) associated with the first codeword; and
  if the CRC associated with the first code word does not pass, means for repeating generation of the second payload and setting a second plurality of payload mask bits in the second payload to values different from a previous generation of the second payload until the CRC associated with the first codeword passes.

34. A non-transitory computer-readable medium for wireless communications performed at a receiving device, comprising:
  instructions that, when executed by at least one processor, cause the at least one processor to:
    receive, in a current transmission, log likelihood ratios (LLRs) of a first codeword corresponding to bits of a first payload, wherein the bits of the first payload are scrambled a first time before being encoded to form the first codeword, and wherein bits of the first codeword are further scrambled a second time after encoding and before transmission of the first codeword;
    generate, in response to receiving the current transmission, a second payload, wherein generating the second payload comprises selectively setting a plurality of payload mask bits in the second payload;
    encode the second payload to form a second codeword;
    generate a first scrambling sequence;
    remove, based on the first scrambling sequence, a first impact in the received LLRs associated with the scrambling of the second time;
    remove, based on the second codeword, a second impact in the received LLRs associated with the scrambling of the first time;
    combine, after the first impact and the second impact in the received LLRs is removed, the received LLRs of the current transmission with LLRs of a previous transmission; and
    decode the first codeword based, at least in part, on the combined LLRs of the current transmission and the LLRs of the previous transmission.

35. The non-transitory computer-readable medium of claim 34, wherein the instructions cause the at least one processor to remove the second impact by removing an impact associated with payload mask bits in the received LLRs using the selectively-set plurality of payload mask bits.

36. The non-transitory computer-readable medium of claim 34, wherein the instructions cause the at least one processor to generate the first scrambling sequence by generating the first scrambling sequence using a gold sequence generator with an initial seed based on a cell ID.

37. The non-transitory computer-readable medium of claim 34, wherein the instructions cause the at least one processor to encode the second payload to form the second codeword further by:
  generating a second scrambling sequence; and
  using the second scrambling sequence to scramble the second payload before encoding the second payload.

38. The non-transitory computer-readable medium of claim 37, wherein the second scrambling sequence is generated using a gold sequence generator with an initial seed based on a cell ID.

39. The non-transitory computer-readable medium of claim 37, wherein the plurality of payload mask bits in the second payload correspond to bit indices S9-S3, S2, S1, S0, C0, and b5-b3 in the second payload.

40. The non-transitory computer-readable medium of claim 39, wherein mask bits corresponding to bit indices S1, S2, C0, b3, b4 and b5 in the second payload are not scrambled when scrambling the second payload.

41. The non-transitory computer-readable medium of claim 37, wherein the instructions cause the at least one processor to encode the second payload to form the second codeword further by:
  generating a cyclic redundancy check (CRC) based on the second payload; and
  including the CRC in the second payload.

42. The non-transitory computer-readable medium of claim 34, wherein the first payload and the second payload are encoded using a polar code.

43. The non-transitory computer-readable medium of claim 34, wherein the instructions cause the at least one processor to generate the second payload by setting a remaining number of bits not included in the plurality of payload mask bits in the second payload to zero.

44. The non-transitory computer-readable medium of claim 34, further comprising instructions that cause the at least one processor to:
  check a cyclic redundancy check (CRC) associated with the first codeword; and
  if the CRC associated with the first code word does not pass, repeat generation of the second payload and set a second plurality of payload mask bits in the second payload to values different from a previous generation of the second payload until the CRC associated with the first codeword passes.

* * * * *